United States Patent
Guzik et al.

(10) Patent No.: US 7,705,609 B2
(45) Date of Patent: Apr. 27, 2010

(54) PHASE FREQUENCY DISTORTION MEASUREMENT SYSTEM

(75) Inventors: Nahum Guzik, Palo Alto, CA (US); Vladislav Klimov, San Jose, CA (US); Semen Volfbeyn, Milpitas, CA (US)

(73) Assignee: Guzik Technical Enterprises, Mountain View, CA (US)

( * ) Notice: Subject to any disclaimer, the term of this patent is extended or adjusted under 35 U.S.C. 154(b) by 276 days.

(21) Appl. No.: 11/944,086

(22) Filed: Nov. 21, 2007

(65) Prior Publication Data

US 2009/0128164 A1    May 21, 2009

(51) Int. Cl.
*G01R 23/20* (2006.01)
(52) U.S. Cl. ........................... 324/620; 324/622
(58) Field of Classification Search .............. 324/620, 324/612, 600, 622, 76.77, 626, 613, 623, 324/76.41, 76.52; 330/147, 149; 332/118; 340/870.26, 658; 455/67.13, 295, 296; 702/57, 702/69, 72, 75
See application file for complete search history.

(56) References Cited

U.S. PATENT DOCUMENTS

| | | | | |
|---|---|---|---|---|
| 6,861,846 B2 * | 3/2005 | Anderson | | 324/623 |
| 7,466,141 B2 * | 12/2008 | Kurosawa et al. | | 324/622 |
| 7,550,977 B2 * | 6/2009 | Quan | | 324/622 |

* cited by examiner

*Primary Examiner*—Hoai-An D Nguyen
(74) *Attorney, Agent, or Firm*—Foley & Lardner LLP; Joseph M. Maraia

(57) ABSTRACT

Disclosed is a method of measuring frequency distortions characteristics of a device under test, the device configured convert an input signal in an input frequency range to an output signal in a different output frequency range. The method includes, for each test frequency $f_i$, where i=1,..., N and N a positive integer, in a selected frequency range, providing a corresponding test signal with multiple frequency components having a measurement component with a frequency $f_i$, a first reference component with a frequency $f_A$, and a second reference component with a frequency $f_B$; inputting the test signals into the device under test; measuring output test signals at the output of the device under test corresponding to the input test signals; and determining, for each test frequency $f_i$, information representative of frequency distortions based on the corresponding input test signal and the corresponding output test signal.

23 Claims, 4 Drawing Sheets

PHASE FREQUENCY DISTORTION MEASUREMENT SYSTEM

BACKGROUND

The present disclosure relates to the frequency responses measurement in devices, where the input and output signals are in different frequency ranges, and, in particular, to the phase frequency distortions measurement in precise measuring devices used in the wireless communication systems.

Wireless networking systems have become a prevalent means in the communication industry. In such systems it is very important to measure/analyze with a high degree of accuracy the various properties of a transmitted/received modulation signal. Therefore a large and perpetually increasing demand exists for high precision spectrum analyzers, vector/signal analyzers etc operating in the RF range.

A typical block diagram of an analyzer is shown in FIG. 1. The down converter 100 transfers the part of the input signal spectrum to be analyzed to the operational frequency range of the analog to digital converter (ADC) 101. The ADC 101 transforms incoming continuous signal into a sequence of digital samples. A processor 102 carries out the necessary analysis of the properties of the processed signal with the presentation of the received results at the display 103.

It is important for the down converter not to create spurious responses, which may substantially distort the processed signal. To attain such a purpose, a conventional down converter contains usually several conversion stages (three or four) with an appropriate selection of the local oscillators frequencies. At each conversion stage a filter is used to separate out the desired frequency components. These filters inevitably introduce frequency distortions in the processed signal. Typically, the area of application of an analyzer requires knowledge of the signal distortions with a high degree of accuracy. For this reason, it is necessary to measure the down converter frequency response and, in particular, the phase frequency distortions.

The down converter 100 and the ADC 101 form the device under test (DUT) 104 that is the subject of the measurement according to the present invention. A feature of the DUT 104 is that its input and output signals lie in different frequency ranges.

The known methods of frequency responses measurement are based on a comparison of the output signal of the device under test with the input signal or with a duplicate of the input signal. However, when the input and the output frequency ranges are different, it is impossible to compare the phases of sine wave components in the input signal and output signal directly: the difference between the phases varies in time continuously.

The present invention describes a method and apparatus for measurement of the phase distortions in a device with different input and output frequency ranges.

SUMMARY

In one aspect, disclosed herein is a method of measuring frequency distortions characteristics of a device under test, said device configured convert an input signal in an input frequency range to an output signal in a different output frequency range, including:

(a) for each test frequency $f_i$, where i=1, ..., N and N a positive integer, in a selected frequency range, providing a corresponding test signal with multiple frequency components including a measurement component with a frequency $f_i$, a first reference component with a frequency $f_A$, and a second reference component with a frequency $f_B$;

(b) inputting said test signals into the device under test;

(c) measuring output test signals at the output of the device under test corresponding to the input test signals; and (d) determining, for each test frequency $f_i$, information representative of frequency distortions based on the corresponding input test signal and the corresponding output test signal; and (e) outputting the information.

In some embodiments, $f_A$ and $f_B$ are unchanged for each of the test signals corresponding to the test frequencies in the selected frequency range, and $f_A$ and $f_B$ are within the selected frequency range.

In some embodiments, the device under test includes a down converting component and a second component having an operating frequency range, and the down converting component operates to transfer the test signals from the selected frequency range to the operating frequency range of the second component. The selected frequency range is within the input frequency range of the down converter. The determining, for each test frequency $f_i$, information representative of frequency distortions based on the corresponding test signal and the corresponding output test signal includes determining frequency distortion introduced by the down converter. In some embodiments, the second component includes an analog to digital converter.

In some embodiments, the method includes for each of a plurality of selected frequency ranges, repeating steps (a)-(e), wherein the plurality of selected frequency ranges substantially spans the input frequency range of the down-converter. In such embodiments, $f_A$ and $f_B$ may vary from one selected frequency range to another.

In some embodiments, the method includes, applying the test signal corresponding to the frequency $f_i$ to the input of the device under test; performing an acquisition of the signal at the output of the device under test; converting the test signal corresponding to the frequency $f_i$ into a duplicate of the test signal; performing an acquisition of the duplicate of the test signal; and processing the acquired signal at the output of the device under test and the acquired duplicate of the test signal to determine information related to frequency distortion at the frequency $f_i$ introduced by the device under test.

In some embodiments, the processing the acquired signal at the output of the device under test and the acquired duplicate of the test signal to find the frequency distortion at the frequency $f_i$ includes comparing phases of the frequency components of the duplicate test signal to phases of the corresponding frequency components of the test signal acquired at the output of the device under test; and determining information related to frequency distortion at the frequency $f_i$ introduced by the device under test based on the comparison.

In some embodiments, the test signal corresponding to the frequency $f_i$ includes a sum of frequency components including: (a) a sinusoidal wave of the measurement frequency $f_i$; (b) a sinusoidal wave of the reference frequency $f_A$; and (c) a sinusoidal wave of the reference frequency $f_B$.

In some embodiments, processing the acquired signal at the output of the device under test and the acquired duplicate of the test signal to determine information related to frequency distortion at the frequency $f_i$ introduced by the device under test includes: determining respective phases PhaseInA, PhaseInB and PhaseInM of the sinusoidal waves with respective frequencies $f_A$, $f_B$ and $f_i$ in the acquired duplicate of the test signal; determining respective phases PhaseOutA, PhaseOutB and PhaseOutM of the sinusoidal waves with respective frequencies $f_A$, $f_B$ and $f_i$ in the test signal acquired at the output of the device under test; determining respective phase changes $dP_A$, $dP_B$ and $dP_i$ of the sinusoidal waves with the respective frequencies $f_A$, $f_B$ and $f_i$ based on the relations $$dP_A = \text{PhaseOut}A - \text{PhaseIn}A;$$

$$dP_B = \text{PhaseOut}B - \text{PhaseIn}B;$$

$$dP_i = \text{PhaseOut}M - \text{PhaseIn}M;$$

determining phase change $\theta_{iA}$ in the sinusoidal wave with the frequency $f_i$ in relation to the sine wave with the frequency $f_A$ based on the relation $$\theta_{iA} = dP_i - dP_A;$$

determining a time shift $\tau$ between the acquisitions of the signal at the output of the device under test and of the duplicate of the test signal based on the relation $$\tau = (dP_B - dP_A)/(f_B - f_A); \text{ and}$$

determining information related to a phase frequency distortion $\theta_i$ corresponding to the frequency $f_i$ introduced by the device under test based on the relation $$\theta_i = \theta_{iA} - \tau^*(f_i - f_A).$$

In some embodiments, converting the test signal corresponding to the frequency $f_i$ into a duplicate of the test signal includes converting the test signal corresponding to the frequency $f_i$ into a digital duplicate of the test signal.

In some embodiments, comparing phases of the frequency components of the duplicate test signal to phases of the corresponding frequency components of the test signal acquired at the output of the device under test includes, for at least one of said frequency components: generating at least one carrier wave with a fixed phase and having a frequency equal to that at least one of said frequency components; and correlating the carrier wave with the at least one frequency component to determine information related to the phase of the at least one frequency component.

In some embodiments, correlating the carrier wave with the at least one frequency component to determine information related to the phase of the at least one frequency component includes measuring in-phase and quadrature portions of the at least one frequency component relative to the carrier wave.

In another aspect, disclosed herein is an apparatus for measuring frequency distortions of a device under test including: a test signal generator configured to, for each test frequency $f_i$, where $i=1, \ldots, N$ and N a positive integer, in a selected frequency range, provide a corresponding test signal with multiple frequency components including a measurement component with a frequency $f_i$, a first reference component with a frequency $f_A$, and a second reference component with a frequency $f_B$, and to input the test signals to the device under test; a measurement unit configured to measure output test signals at the output of the device under test corresponding to the input test signals; and a processing unit configured to determine for each test frequency $f_i$, information representative of frequency distortions based on the corresponding input test signal and the corresponding output test signal.

In some embodiments, $f_A$ and $f_B$ are the unchanged for each of the test signals corresponding to the test frequencies in the selected frequency range, and $f_A$ and $f_B$ are within the selected frequency range.

In some embodiments, the apparatus further includes the device under test.

In some embodiments, the device under test includes a down converting component and a second component having an operating frequency range, and the down converting component is configured to transfer the input test signals from the selected frequency range to the operating frequency range of the second component, and the selected frequency range is within the input frequency range of the down converter.

In some embodiments, the second component includes an analog to digital converter.

In some embodiments, the apparatus includes a splitter configured to produce a duplicate test signal for each of test signals and to apply each test signal to the input of the device under test. The measurement unit is configured to perform an acquisition of each of the output test signals at the output of the device under test and perform an acquisition of each of the duplicates of the test signal. The processing unit is configured to process the acquired output signals at the output of the device under test and the acquired duplicates of the test signals to determine information related to frequency distortion at the corresponding test frequencies introduced by the device under test.

In some embodiments, measurement unit includes: an input signal memory configured to receive and store at least a portion of one of the duplicate test signals; and an output signal memory configured to receive and store at least a portion of one of the output test signals acquired at the output of the device under test.

In some embodiments, the processor is configured to, for each frequency $f_i$, compare phases of the frequency components of the corresponding duplicate test signal to the phases of the frequency components of the corresponding output test signal acquired at the output of the device under test; and determine information related to frequency distortion at the frequency $f_i$ introduced by the device under test based on the comparison.

In some embodiments, the signal generator includes: one or more oscillators configured to generate, for each frequency $f_i$, a sinusoidal wave of the measurement frequency $f_i$, a sinusoidal wave of the reference frequency $f_A$, a sinusoidal wave of the reference frequency $f_B$; and an adder unit configured to, for each frequency, $f_i$, generate a corresponding test signal including a sum of a sinusoidal wave of the measurement frequency $f_i$, a sinusoidal wave of the reference frequency $f_A$, a sinusoidal wave of the reference frequency $f_B$.

In some embodiments, the apparatus includes one or more phase measurement units, and is configured to, for each frequency $f_i$:

determine respective phases PhaseInA, PhaseInB and PhaseInM of the sinusoidal waves with respective frequencies $f_A$, $f_B$ and $f_i$ in the acquired duplicate of the test signal; determine respective phases PhaseOutA, PhaseOutB and PhaseOutM of the sinusoidal waves with respective frequencies $f_A$, $f_B$ and $f_i$ in the output signal acquired at the output of the device under test; determine respective phase changes $dP_A$, $dP_B$ and $dP_i$ of the sinusoidal waves with the respective frequencies $f_A$, $f_B$ and $f_i$ based on the relations $$dP_A = \text{PhaseOut}A - \text{PhaseIn}A;$$

$$dP_B = \text{PhaseOut}B - \text{PhaseIn}B;$$

$$dP_i = \text{PhaseOut}M - \text{PhaseIn}M;$$

determine a phase change $\theta_{iA}$ in the sine wave with the frequency $f_i$ in relation to the sine wave with the frequency $f_A$ based on the relation $$\theta_{iA} = dP_i - dP_A;$$

determine a time shift τ between the acquisitions of the signal at the output of the device under test and of the duplicate of the test signal based on the relation $\tau=(dP_B-dP_A)/(f_B-f_A)$; and determine information related to a phase frequency distortion $\theta_i$ corresponding to the frequency $f_i$ introduced by the device under test based on the relation $\theta_i=\theta_{iA}-\tau*(f_i-f_A)$.

In some embodiments, the one or more phase measurement units comprise a correlator configured to determine phase information about a frequency component of a signal by comparing the signal to a carrier wave having a fixed phase and frequency equal to the frequency of said signal.

Various embodiments may include any of the above described features, alone or in combination.

DETAILED DESCRIPTION OF THE PREFERRED EMBODIMENT

The width of the input frequency range of an analyzer (RF range, usually several GHz) is far in excess of the width of the operational range of an ADC (IF range, usually about a hundred MHz). Therefore to receive a complete description of the phase frequency distortions the RF range is divided into chunks. The width of each chunk approximately equals the width of the operational range of the ADC. The chunks together substantially cover the input RF range of the analyzer. The measurements of the phase frequency distortions according to the present invention are carried out for each chunk independently and successively. The results obtained for different chunks are combined together to produce the complete picture of phase frequency distortions of the DUT.

The phase frequency distortions measurement for a chunk is performed step by step, for one frequency $f_i$ at each step. The measurement frequencies $f_i$, $1<=I<=N$, cover the whole chunk. The number N of the measurement frequencies $f_i$ is chosen to be big enough to provide for measuring of all substantial details of the phase frequency distortions in one chunk.

Figure 1:
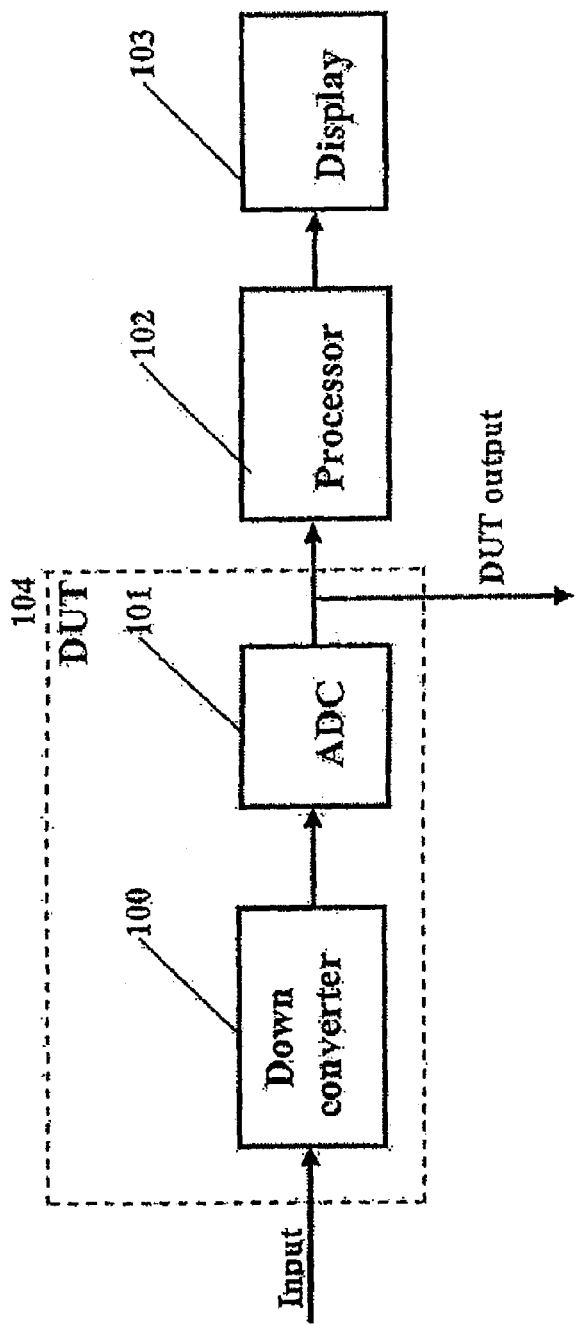
FIG. 1 is a typical block diagram of a conventional analyzer.
Figure 2:
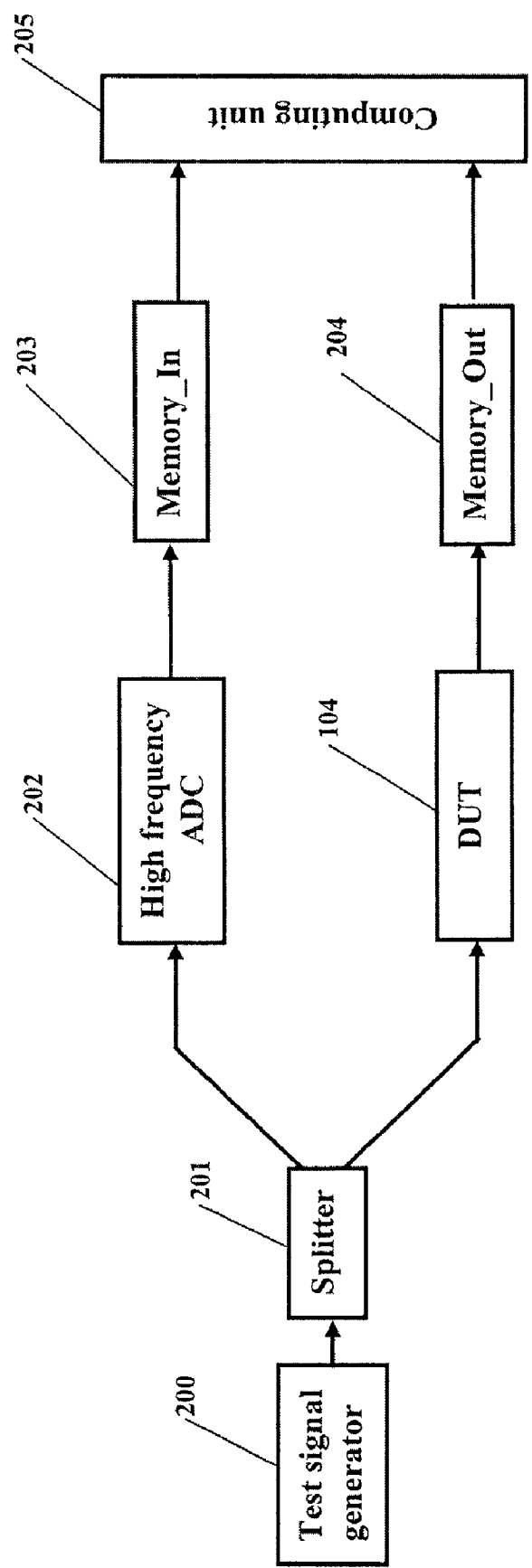
FIG. 2 is a block diagram of the phase distortions measurement according to the present invention.

The block diagram of phase distortion measurement at one measurement frequency $f_i$ according to the present invention is shown in the FIG. 2. The test signal generator 200 creates a test signal that along with other components contains a sine wave of the measurement frequency $f_i$. The splitter 201 directs the test signal towards two different pathways that go to the input of the DUT 104 and to the input of a high frequency ADC 202.

The high frequency ADC 202 should have a sufficiently high sampling rate to ensure absence of the alias distortions while processing the signal that lies in the RF range. Such an ADC inevitable has relative small number of bits (usually eight or less). The small number of bits prevents the use of the high frequency ADC in such measuring devices as analyzers but it permits accurate enough phases measurement if the measurement time is big enough and averaging is used. The output signal of the high frequency ADC 202 is a digital duplicate of the test signal at the input of the DUT 104.

The phase distortion measurement at one measurement frequency $f_i$ begins with a signals acquisition, the digital duplicate of the DUT 104 input signal being loaded into the Memory_In 203 and the DUT 104 output signal being loaded into the Memory_Out 204. The outputs of the Memory_In 203 and the Memory_Out 204 are connected to the inputs of the computing unit 205. The arrays of digital samples that proceed from the Memory_In 203 and the Memory_Out 204 to the computing unit 205 contain the complete information about the DUT 104 input and output signals. It enables the computing unit 205 to find (after the appropriate calculation) the DUT phase distortion $\theta_i$ at the measurement frequency $f_i$.

The computing unit 205 processes the arrays of the signals that are kept in the Memory_In 203 and the Memory_Out 204, suppressing the ill effect of the noise and different distortions (first of all the quantization errors of the ADC's). It finds the phase PhaseInM of the sine component of the measurement frequency $f_i$ in the signal at the DUT input and the phase PhaseOutM of the correspondent component in the signal at the DUT output. The phases PhaseInM and PhaseOutM are found for a fixed reference moment of time in the interval of the signals acquisition, for example in the start moment of the acquisition.

The difference $dP_i$ between the phases PhaseOutM and PhaseInM is a sum of three terms. First, by the joint action of the conversion stages of a down converter all the components of the processed signal are shifted down by the transfer frequency $f_T$. Therefore at any moment t the phase PhaseOutM lags behind the phase PhaseInM by a value $2*\pi*fr*t$.

Secondly, the frequency instability of local oscillators in the down converter 100 results in the permanent change of the carrier phases. In the course of a frequency conversion the phase of the carrier is added to the phases of all signal frequency components alike. As a result the phase of any frequency component of a signal passing through the down converter acquires a complement $P_c$ (c is for "carriers"), the same for all frequencies. For that reason the difference $dP_i$ between the phases PhaseOutM and PhaseInM contains a random complement $P_c$.

Thirdly, the non-uniformity of the frequency response in the filters of the down converter 100 causes a phase shift $\phi_i$ in the component of the processed signal with the frequency $f_i$. Hence, the total difference $dP_i$ between the phases PhaseOutM and PhaseInM obeys the equation:

$$dP_i=2*\pi*fr*t+P_c+\phi_i. \qquad (1)$$

The expression (1) contains one term that varies in time and one term with a random value. For this reason the measurement of the phases PhaseOutM and PhaseInM and calculation of their difference dPM give no way to detect the phase shift $\phi_i$ in the DUT.

To overcome the mentioned difficulty, a test signal is provided which contains a reference sine component of the frequency $f_A$ along with the measurement sine component of the frequency $f_i$. The frequency $f_A$ lies inside the frequency chunk being measured and remains unchanged during all the measurements in this chunk. The computing unit 205 along with the phases of the measurement sine wave finds the phase PhaseInA of the reference sine component of the frequency $f_A$ in the signal at the DUT input and the phase PhaseOutA of the correspondent component in the signal at the DUT output.

Similarly to the equation (1), the difference $dP_A$ between the phases PhaseOutA and PhaseInA equals the sum of three terms:

$$dP_A = 2*\pi*f_T*t + P_c + \phi_A. \quad (2)$$

Here $\phi_A$ is a phase shift in the component of the processed signal with the frequency $f_A$ that occurs in the course of passing through the DUT 104.

By combining the equations (1) and (2) the next expression for the phase change $\theta_{iA}$ in the sine wave with the frequency $f_i$ in relation to the sine wave with the frequency $f_A$ may be obtained. By the definition $$\theta_{iA} = dP_i - dP_A, \quad (3)$$

and after the substitution of the values dPM-dPA from the equations (1) and (2)

$$\theta_{iA} = \phi_i - \phi_A. \quad (4)$$

The term $2*\pi*f_T*t$ that varies on time and the random term $P_c$ canceled out in the equation (4).

Since the frequency $f_A$ remains unchanged during all measurements in one chunk the set $\theta_{iA}$ for all frequencies $f_i$, $1 \le i \le N$, describes the phase frequency distortions in the chunk correctly to a constant complement $\phi_A$. In all known communication systems a constant compliment to the phase frequency response does not causes distortions in the transmitted signal. Therefore the complement $\phi_A$ in the equation (3) may be considered immaterial.

The equation (3) was received under an assumption that the acquisitions of the input and output signals of the DUT are made simultaneously, so that the fixed reference moment of time in the interval of the acquisition is the same for of the input and output signals of the DUT. In the real life, however, each acquisition starts in a moment that is specified by a correspondent triggering circuit. Because of the inevitable time errors in the operation of the triggering circuits, the acquired arrays of the input and output signals are shifted in time, one in reference to the other, for an interval $\tau$. As a result the phase of any component with the frequency f in the output signal array assumes a complement $f*\tau$ in relation to the phase of the correspondent component in the input signal array. The factor $\tau$ is the same for all frequencies in one measurement, but it varies randomly from one measurement to another.

To overcome the difficulty that arises from the random time shift $\tau$ between the arrays in the Memory_In 203 and the Memory_Out 204 the test signal according to the present invention contains an additional reference sine component of the frequency $f_B$ (together with the measurement sine component of the frequency $f_i$ and a reference sine component of the frequency $f_A$). The frequency $f_B$ lies inside the chunk being measured and remains unchanged during all measurements in this chunk (the same as with the frequency $f_A$). The computing unit 205 along with other phases finds the phase PhaseInB of the reference sine component of the frequency $f_B$ in the signal at the DUT input and the phase PhaseOutB of the correspondent component in the signal at the DUT output. The difference $dP_B$ between the phases PhaseOutB and PhaseInB is calculated as well. After that the time shift $\tau$ is calculated according to an equation:

$$\tau = (dP_B - dP_A)/(f_B - f_A). \quad (5)$$

The final value of the DUT phase distortion $\theta_i$ at the frequency $f_i$ is calculated according to the following equation:

$$\theta_i = \theta_{iA} - \tau*(f_i - f_A). \quad (6)$$

According the present invention the test signal generator 200 and the computing unit 205 are constructed in a way that enables finding the phase frequency distortions by the calculations in line with the equations (1) . . . (6).

Figure 3:
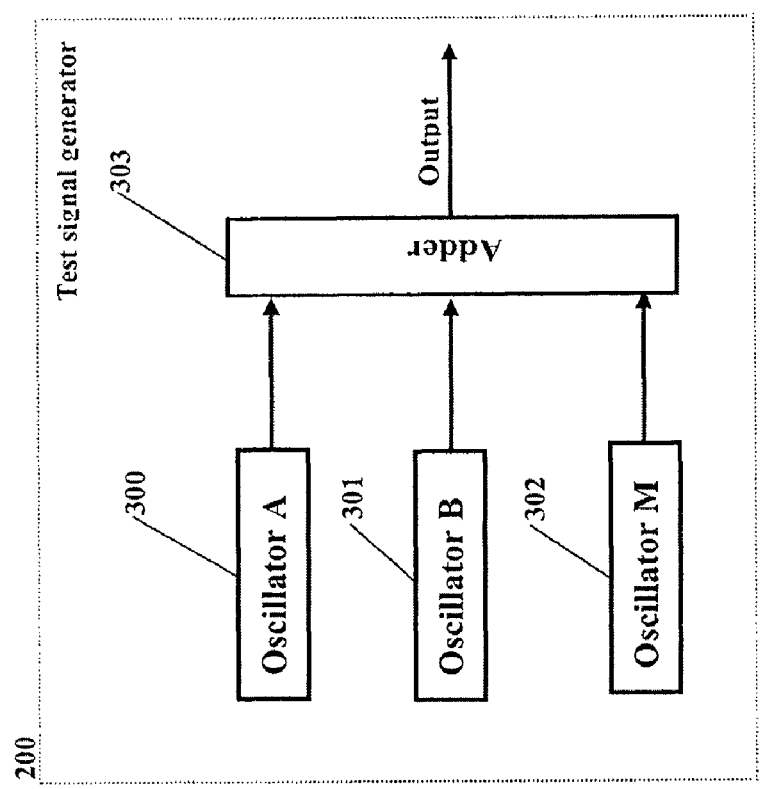
FIG. 3 is a block diagram of the test signal generator according to the present invention.

As seen in FIG. 3 the test signal generator 200 consists of an oscillator A 300, an oscillator B 301, an oscillator M 302 and an adder 303. The test signal that comes to the output of the test signal generator 200 is a sum of three sine waves:

(a) a reference sine wave A with the frequency $f_A$;
(b) a reference sine wave B with the frequency $f_B$;
(c) a measurement sine wave with the frequency $f_i$.

As it was said before, the reference frequencies $f_A$ and $f_B$ are kept constant all the time during the measurements in one RF range chunk. The incorporation of two reference frequencies into the test signal produces the possibility for the computing unit 205 to eliminate the random complements $P_c$ and $f*\tau$, while calculating the phase change that the measurement sine wave with the frequency $f_i$ experiences during the passage through the DUT 104.

Figure 4:
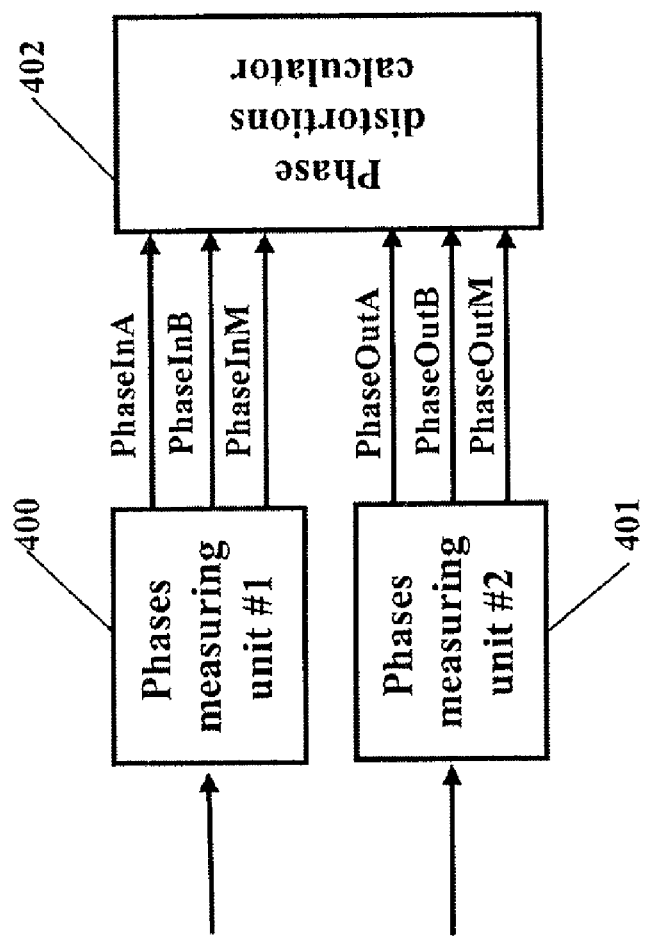
FIG. 4 is a block diagram of the computing unit according to the present invention.

The block diagram of the computing unit 205 is shown in FIG. 4. It contains two phases measuring units 400, 401 and a phase distortions calculator 402. The phases measuring unit #1 400 processes the digital duplicate of the DUT input signal and computes the phases PhaseInA, PhaseInB and PhaseInM of the sine waves with the frequencies $f_A$, $f_B$ and $f_i$ correspondently. The phases measuring unit #2 403 processes the DUT output signal and computes the phases PhaseOutA, PhaseOutB and PhaseOutM of the sine waves with the frequencies $f_A$, $f_B$ and $f_i$ correspondently. As it was mentioned earlier, the enumerated phases are computed for a fixed reference moment of time in the interval of correspondent signal acquisition, for example in relation to the start of the acquisition.

A phases measuring unit may be constructed as a parallel bank of three correlators supplemented with phase calculators. Each correlator has a carrier. The carriers are sine waves with frequencies $f_A$, $f_B$ or $f_i$, each of the sine waves having a zero at the reference time moment. A correlator finds the amplitudes of the in_phase (I) and quadrature (Q) components in the processed signal, the in_phase and quadrature components being determined in relation to the correlator carrier. The phase calculator calculates the sine wave phase as an arc tangent of the ratio Q/I. A sufficient accuracy of the phase computations may be achieved by choosing the averaging time of the correlators to be big enough.

The phase distortions calculator 402 as the first step calculates the phase changes $dP_A$, $dP_B$ and $dP_i$ that the sine waves with the frequencies $f_A$, $f_B$ and $f_i$ experience during the passage through the device under test 104 according to the following equations $$dP_A = \text{PhaseOut}A - \text{PhaseIn}A; \quad (6)$$

$$dP_B = \text{PhaseOut}B - \text{PhaseIn}B; \quad (7)$$

$$dP_i = \text{PhaseOut}M - \text{PhaseIn}M; \quad (8)$$

As the second step the estimation of the phase change $\theta_{iA}$ in the sine wave with the frequency $f_i$ in relation to the sine wave with the frequency $f_A$ without regard for the time shift $\tau$ is calculated according to the equation (3).

As the third step an estimation of the time shift $\tau$ between the signals stored in the Memory_In 203 and in the Memory_Out 204 is calculated according to the equation (5).

As the forth step the value of the DUT phase distortion $\theta i$ at the frequency fi is calculated according to the equation (6). The form of the equation (6) ensures the canceling out of the random complements Pc and f*τ that were present in all the phase differences $dP_A$, $dP_B$ and $dP_i$.

One or more or any part thereof of the techniques described above can be implemented in computer hardware or software, or a combination of both. The method can be implemented in computer programs using standard programming techniques following the method and figures described herein. Moreover, the program can run on dedicated integrated circuits preprogrammed for that purpose.

Although the examples above describe the use of bursts which include sine waves, it is to be understood that any suitable sinusoidal wave may be used. As used herein, the term "sinusoidal wave" refers to any wave with a waveform whose shape does not deviate from that of a sine wave in an amount sufficient to inhibit the proper functioning of the analyzer/equalizer for the application at hand.

A number of the details of an implementation of the present invention were described above. It should be apparent to those skilled in the art that various modifications are possible without departing from the principles of the present invention. Accordingly, such modifications are understood to be within the scope of the following claims.

What is claimed is:

1. A method of measuring frequency distortions of a device under test, said device to configured convert an input signal in an input frequency range to an output signal in a different output frequency range, comprising:
   (a) for each test frequency $f_i$, where i=1, . . . , N and N a positive integer, in a selected frequency range, providing a corresponding test signal with multiple frequency components comprising a measurement component with a frequency $f_i$, a first reference component with a frequency $f_A$, and a second reference component with a frequency $f_B$;
   (b) inputting said test signals into the device under test;
   (c) measuring output test signals at the output of the device under test corresponding to the input test signals; and
   (d) determining, for each test frequency $f_i$, information representative of frequency distortions based on the corresponding input test signal and the corresponding output test signal; and
   (e) outputting the information.

2. The method of claim 1, wherein $f_A$ and $f_B$ are unchanged for each of the test signals corresponding to the test frequencies in the selected frequency range, and $f_A$ and $f_B$ are within the selected frequency range.

3. The method of claim 2, wherein:
   the device under test comprises a down converting component and a second component having an operating frequency range, and the down converting component operates to transfer the test signals from the selected frequency range to the operating frequency range of the second component,
   the selected frequency range is within the input frequency range of the down converter, and
   the determining, for each test frequency $f_i$, information representative of frequency distortions based on the corresponding test signal and the corresponding output test signal comprises determining frequency distortion introduced by the down converter.

4. The method of claim 3, further comprising:
   for each of a plurality of selected frequency ranges, repeating steps (a)-(e), wherein the plurality of selected frequency ranges substantially spans the input frequency range of the down-converter, and
   wherein $f_A$ and $f_B$ may vary from one selected frequency range to another.

5. The method of claim 2, comprising
   applying the test signal corresponding to the frequency $f_i$ to the input of the device under test;
   performing an acquisition of the signal at the output of the device under test;
   converting the test signal corresponding to the frequency $f_i$ into a duplicate of the test signal;
   performing an acquisition of the duplicate of the test signal; and
   processing the acquired signal at the output of the device under test and the acquired duplicate of the test signal to determine information related to frequency distortion at the frequency $f_i$ introduced by the device under test.

6. The method of claim 5, wherein processing the acquired signal at the output of the device under test and the acquired duplicate of the test signal to find the frequency distortion at the frequency $f_i$ comprises:
   comparing phases of the frequency components of the duplicate test signal to phases of the corresponding frequency components of the test signal acquired at the output of the device under test; and
   determining information related to frequency distortion at the frequency $f_i$ introduced by the device under test based on the comparison.

7. The method of claim 6, wherein the test signal corresponding to the frequency $f_i$ comprises a sum of frequency components comprising:
   (a) a sinusoidal wave of the measurement frequency $f_i$;
   (b) a sinusoidal wave of the reference frequency $f_A$; and
   (c) a sinusoidal wave of the reference frequency $f_B$.

8. The method of claim 7, wherein processing the acquired signal at the output of the device under test and the acquired duplicate of the test signal to determine information related to frequency distortion at the frequency $f_i$ introduced by the device under test comprises:
   determining respective phases PhaseInA, PhaseInB and PhaseInM of the sinusoidal waves with respective frequencies $f_A$, $f_B$ and $f_i$ in the acquired duplicate of the test signal;
   determining respective phases PhaseOutA, PhaseOutB and PhaseOutM of the sinusoidal waves with respective frequencies $f_A$, $f_B$ and $f_i$ in the test signal acquired at the output of the device under test;
   determining respective phase changes $dP_A$, $dP_B$ and $dP_i$ of the sinusoidal waves with the respective frequencies $f_A$, $f_B$ and $f_i$ based on the relations $dP_A$=PhaseOut$A$−PhaseIn$A$;

$dP_B$=PhaseOut$B$−PhaseIn$B$;

$dP_i$=PhaseOut$M$−PhaseIn$M$;

determining phase change $\theta_{iA}$ in the sinusoidal wave with the frequency $f_i$ in relation to the sine wave with the frequency $f_A$ based on the relation $\theta_{iA}=dP_i-dP_A$;

determining a time shift τ between the acquisitions of the signal at the output of the device under test and of the duplicate of the test signal based on the relation $\tau=(dP_B-dP_A)/(f_B-f_A)$;

determining information related to a phase frequency distortion $\theta_i$ corresponding to the frequency $f_i$ introduced by the device under test based on the relation $\theta_i=\theta_{iA}-\tau*(f_i-f_A)$.

9. The method of claim 5, wherein converting the test signal corresponding to the frequency $f_i$ into a duplicate of the test signal comprises converting the test signal corresponding to the frequency $f_i$ into a digital duplicate of the test signal.

10. The method of claim 6, wherein comparing phases of the frequency components of the duplicate test signal to phases of the corresponding frequency components of the test signal acquired at the output of the device under test comprises, for at least one of said frequency components:
    generating at least one carrier wave with a fixed phase and having a frequency equal to that at least one of said frequency components; and
    correlating the carrier wave with the at least one frequency component to determine information related to the phase of the at least one frequency component.

11. The method of claim 10, wherein correlating the carrier wave with the at least one frequency component to determine information related to the phase of the at least one frequency component comprises measuring in-phase and quadrature portions of the at least one frequency component relative to the carrier wave.

12. The method of claim 3, wherein the second component comprises an analog to digital converter.

13. An apparatus for measuring frequency distortions of a device under test, said device configured to convert an input signal in an input frequency range to an output signal in a different output frequency range, comprising:
    a test signal generator configured to, for each test frequency $f_i$, where $i=1, \ldots, N$ and N a positive integer, in a selected frequency range, provide a corresponding test signal with multiple frequency components comprising a measurement component with a frequency $f_i$, a first reference component with a frequency $f_A$, and a second reference component with a frequency $f_B$, and to input the test signals to the device under test;
    a measurement unit configured to measure output test signals at the output of the device under test corresponding to the input test signals; and
    a processing unit configured to determine for each test frequency $f_i$, information representative of frequency distortions based on the corresponding input test signal and the corresponding output test signal.

14. The apparatus of claim 13, wherein $f_A$ and $f_B$ are the unchanged for each of the test signals corresponding to the test frequencies in the selected frequency range, and $f_A$ and $f_B$ are within the selected frequency range.

15. The apparatus of claim 14, further comprising the device under test.

16. The apparatus of claim 15, wherein
    the device under test comprises a down converting component and a second component having an operating frequency range, and the down converting component is configured to transfer the input test signals from the selected frequency range to the operating frequency range of the second component, and
    the selected frequency range is within the input frequency range of the down converter.

17. The apparatus of claim 16, wherein the second component comprises an analog to digital converter.

18. The apparatus of claim 16, further comprising
    a splitter configured to produce a duplicate test signal for each of test signals and to apply each test signal to the input of the device under test; and
    wherein the measurement unit is configured to
        perform an acquisition of each of the output test signals at the output of the device under test and
        perform an acquisition of each of the duplicates of the test signal; and
    wherein the processing unit is configured to process the acquired output signals at the output of the device under test and the acquired duplicates of the test signals to determine information related to frequency distortion at the corresponding test frequencies introduced by the device under test.

19. The apparatus of claim 18, wherein the measurement unit comprises:
    an input signal memory configured to receive and store at least a portion of one of the duplicate test signals; and
    an output signal memory configured to receive and store at least a portion of one of the output test signals acquired at the output of the device under test.

20. The apparatus of claim 18, wherein the processor is configured to, for each frequency $f_i$:
    compare phases of the frequency components of the corresponding duplicate test signal to the phases of the frequency components of the corresponding output test signal acquired at the output of the device under test; and
    determine information related to frequency distortion at the frequency $f_i$ introduced by the device under test based on the comparison.

21. The apparatus of claim 20, wherein the signal generator comprises:
    one or more oscillators configured to generate, for each frequency $f_i$, a sinusoidal wave of the measurement frequency $f_i$, a sinusoidal wave of the reference frequency $f_A$, a sinusoidal wave of the reference frequency $f_B$; and
    an adder unit configured to, for each frequency, $f_i$, generate a corresponding test signal comprising a sum of a sinusoidal wave of the measurement frequency $f_i$, a sinusoidal wave of the reference frequency $f_A$, a sinusoidal wave of the reference frequency $f_B$.

22. The apparatus of claim 21, comprising one or more phase measurement units, and configured to, for each frequency $f_i$:
    determine respective phases PhaseInA, PhaseInB and PhaseInM of the sinusoidal waves with respective frequencies $f_A$, $f_B$ and $f_i$ in the acquired duplicate of the test signal;
    determine respective phases PhaseOutA, PhaseOutB and PhaseOutM of the sinusoidal waves with respective frequencies $f_A$, $f_B$ and $f_i$ in the output signal acquired at the output of the device under test;
    determine respective phase changes $dP_A$, $dP_B$ and $dP_i$ of the sinusoidal waves with the respective frequencies $f_A$, $f_B$ and $f_i$ based on the relations $$dP_A = \text{PhaseOut}A - \text{PhaseIn}A;$$

$$dP_B = \text{PhaseOut}B - \text{PhaseIn}B;$$

$$dP_i = \text{PhaseOut}M - \text{PhaseIn}M;$$

determine a phase change $\theta_{iA}$ in the sine wave with the frequency $f_i$ in relation to the sine wave with the frequency $f_A$ based on the relation $$\theta_{iA} = dP_i - dP_A;$$

determine a time shift $\tau$ between the acquisitions of the signal at the output of the device under test and of the duplicate of the test signal based on the relation $$\tau = (dP_B - dP_A)/(f_B - f_A); \text{ and}$$

determine information related to a phase frequency distortion $\theta_i$ corresponding to the frequency $f_i$ introduced by the device under test based on the relation $\theta_i = \theta_{iA} - \tau*(f_i - f_A)$.

23. The apparatus of claim 22, wherein the one or more phase measurement units comprise a correlator configured to determine phase information about a frequency component of a signal by comparing the signal to a carrier wave having a fixed phase and frequency equal to the frequency of said signal.

* * * * *